(12) United States Patent
Amano

(10) Patent No.: US 8,160,523 B2
(45) Date of Patent: Apr. 17, 2012

(54) CHANNEL DETECTING METHOD FOR DIGITAL BROADCAST AND RECEIVER USING THE SAME

(75) Inventor: Shigeru Amano, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 1218 days.

(21) Appl. No.: 11/873,226

(22) Filed: Oct. 16, 2007

(65) Prior Publication Data

US 2008/0100752 A1    May 1, 2008

(51) Int. Cl.
*H04B 1/18* (2006.01)
(52) U.S. Cl. .................. 455/161.1; 455/3.02; 455/150.1; 455/178.1; 455/182.1; 455/180.2; 348/725; 348/729; 348/731
(58) Field of Classification Search .................. 455/3.02, 455/77, 130, 150.1, 178.1, 182.1, 192.3, 455/180.2, 188.2, 191.1, 161.1; 348/706, 348/725, 729, 731
See application file for complete search history.

(56) References Cited

U.S. PATENT DOCUMENTS

2003/0142760 A1* 7/2003 Kim et al. ..................... 375/326
2004/0170398 A1* 9/2004 Nishigaki ..................... 386/125

FOREIGN PATENT DOCUMENTS

JP 2004-179928 6/2004
JP 2005-333190 12/2005

* cited by examiner

*Primary Examiner* — Tuan Pham
(74) *Attorney, Agent, or Firm* — Studebaker & Brackett PC; Donald R. Studebaker

(57) ABSTRACT

A channel detecting method executes a process for instructing a broadcast wave scan start, a process for performing tuning control, a process for starting initialization/operation of an OFDM demodulation section and starting the counting of a synchronous establishment timer unit, a process for determining that broadcasting is being conducted, a process for determining the expiration of the synchronous establishment timer unit, a process for outputting a TS signal and notifying that a broadcast parameter is being detected, a process for instructing transition to the next channel, a process for making a decision as to a final channel, a process for performing a transition operation, and a process for terminating a broadcast wave scan. When no broadcast is being conducted, a demodulation unit, an error correction unit and a decoder are not operated.

10 Claims, 8 Drawing Sheets

CHANNEL DETECTING METHOD FOR DIGITAL BROADCAST AND RECEIVER USING THE SAME

BACKGROUND OF THE INVENTION

The present invention relates to a channel detecting method for digital broadcast, which performs the detection of a broadcast channel at high speed, and a receiver using the channel detecting method, such as a digital terrestrial receiver.

FIGS. 2(a) and 2(b) are diagrams showing a conventional method of demodulating a digital broadcast. The same figure (a) is a diagram showing a schematic process of a broadcast wave, and the same figure (b) is a frame configuration diagram of a baseband signal (called broadcast wave signal).

A conventional process of a broadcast wave UHF is performed after the broadcast wave UHF containing a channel number and a physical frequency transmitted from a broadcast station has been subjected to reception processing. The broadcast wave UHF subjected to the reception processing is selected by tuner processing and tuned to a predetermined frequency, after which it is outputted as a baseband signal S11b. The baseband signal S11b is subjected to demodulating processing and thereby outputted as a transport stream (hereinafter called "TS") signal Sts.

The baseband signal S11b comprises one frame FM with a plurality of transmission symbols SBs as a unit. Each transmission symbol SB is constituted of a guard interval GI and an effective symbol S.

In the conventional digital broadcast demodulating method, when distortion and a multipath exist in a transmission line, the orthogonality of a received signal is damaged and disturbed and hence inter carrier interference (hereinafter called "ICI") occurs in a demodulated signal, thus degrading an error rate. In order to solve it, ineffective guard intervals GI for ICI absorption are provided as buffer data portions.

As examples of such a conventional digital broadcast channel detecting method and a receiver using the same, there have been proposed ones described in, for example, patent documents (Japanese Unexamined Patent Publication Nos. 2004-179928 and 2005-333190) or the like.

The patent document 1 has described a channel detecting method for causing a digital broadcast channel to be reliably stored in a channel list where a reception environment is unstable, and a receiver using the same. The patent document 2 has described a channel detecting method for acquiring each broadcast parameter contained in a network information table (hereinafter called "NIT") and performing, by some channels alone, a process for determining whether it corresponds to a targeted broadcast wave, and a receiver using the same.

The digital broadcast receiving method and its receiver described in each of the patent documents 1 and 2 are however accompanied by a drawback that when they are applied to a portable terminal that frequently changes in broadcast area, such as a cellular phone, a car navigation system or the like on the precondition that the receiver is not moved from its installation location, a broadcast channel may be misdetected. In order to solve such a drawback, there has been proposed a digital terrestrial broadcasting receiver mountable onto portable terminals such as a cellular phone that frequently changes in broadcast area such as shown in FIG. 3, a car navigation system and the like.

FIG. 3 is a schematic block diagram showing the conventional digital terrestrial broadcasting receiver.

The digital terrestrial broadcasting receiver has a reception section 11 which receives a broadcast wave UHF and outputs a baseband signal S11b, and an orthogonal frequency division multiplexing (hereinafter called "OFDM") demodulation unit 12 which demodulates the baseband signal S11b and outputs the demodulated baseband signal S11b as a TS signal Sts. A decoder 13, which decodes the TS signal Sts thereby to output output data Dout therefrom and outputs a decode signal S13, is connected to the output side of the OFDM demodulation section 12. Further, a CPU 14, which outputs control signals S14-1, S14-2 and S14-3, is connected to the decoder 13.

The reception section 11 comprises an antenna 11a for receiving the broadcast wave UHF, and a tuner 11b which selects a channel in a predetermined frequency band with respect to the broadcast wave UHF and tunes in thereto, and outputs a baseband signal S11b. The OFDM demodulation section 12 comprises a synchronous establishment unit 12a which performs synchronous establishment on the baseband signal S11b thereby to output a synchronous playback or reproduction signal S12a, a demodulation unit 12b which performs fast Fourier transform on the synchronous recovery signal S12a thereby to output a demodulated signal S12b, and an error correction unit 12c which corrects an error of the demodulated signal S12b and effects deinterleave processing thereon thereby to output a TS signal Sts.

The operation of the digital terrestrial broadcasting receiver shown in FIG. 3 will next be explained.

The antenna 11a first receives a broadcast wave UHF therein and inputs it to the tuner 11b. The tuner 11b causes the broadcast wave UHF to tune to a predetermined frequency, removes an unnecessary frequency band by an unillustrated bandpass filter and outputs the broadcast wave UHF to the OFDM demodulation section 12 as a baseband signal S11b.

The baseband signal S11b is first synchronously established by a synchronous establishment unit 12a and outputted as a synchronous recovery signal S12a. The synchronous recovery signal S12a is subjected to demodulating processing at the demodulation unit 12b and outputted as a demodulated signal S12b. The demodulated signal S12b is subjected to an error correction and deinterleave processing at the error correction unit 12c and outputted to the decoder 13 as a TS signal Sts.

The TS signal Sts is separated into multiplexed various information at the decoder 13 and outputted to a speaker, an earphone, a display device and the like unillustrated in the drawing as output data Dout. An image display and voice reproduction are performed based on the output data Dout. Further, the decoder 13 outputs a decode signal S13 corresponding to information about a decode situation to the CPU 14. The CPU 14 outputs a tuning control signal S14-1 to the tuner 11b, outputs a control signal S14-2 to the OFDM demodulation section 12 and outputs a control signal 314-3 to the decoder 13.

Each broadcast parameter for associating a remote control channel number and a physical frequency with each other can be obtained at the decoder 13. In order to obtain the broadcast parameter, the predetermined broadcast wave UPH applied to the tuner 11b is subjected to the demodulating processing at the OFDM demodulation section 12 and outputted as a TS signal Sts. And the corresponding broadcast parameter is extracted from the TS signal Sts at the decoder 13. Upon a broadcast wave scan, the retrieval of broadcast parameters is imposed on all channels given.

If the broadcast wave scan is executed in the digital terrestrial broadcasting receiver shown in FIG. 3, then a scan time Tscan for executing a broadcast wave scan for one channel is expressed in the following equation (1) assuming that a tuning processing time of the tuner 11b is T11b, a demodulation processing time of the OFDM demodulation section 12 is T12, a decode processing time of the decoder 13 is T13, and a control processing time for performing control from the CPU 14 to each block is T14:

$$Tscan = (T11b + T12 + T13 + T14). \quad (1)$$

Further, since the demodulation processing time T12 of the OFDM demodulation section 12 can be brought into detailed form as a synchronous establishment processing time T12a of the synchronous establishment unit 12a, a conversion processing time T12b of the demodulation unit 12b, and an error correction processing time T12c of the error correction unit 12c, the following equation (2) is obtained from the equation (1):

$$Tscan = (T11b + T12a + T12b + T12c + T13 + T14) \quad (2)$$

Assuming now that the number of all given channels is N and a total time necessary for the entire broadcast wave scan is Tt, the following equation (3) is obtained:

$$Tt = Tscan \times N \quad (3)$$
$$= \left( \begin{array}{c} T11b + T12a + T12b + \\ T12c + T13 + T14 \end{array} \right) \times N$$

However, the digital terrestrial broadcasting receiver shown in FIG. 3 involves the following problems.

In the digital television broadcasting of the present situation, as shown in FIG. 2, the situation is that the number of all given channels is 50 and the number of channels at which broadcasting is being conducted in its region is less than 10. Since it is necessary to properly recognize that broadcasting is not conducted over channels greater than or equal to the remaining 40 channels, there is a need to sufficiently take the scan time Tscan at which the presence or absence of broadcast can be determined. The scan time Tscan for performing retrieval and determination needs a longer period of time with respect to each channel including a broadcast parameter. Therefore, the total time Tt for retrieving all the given channels needs an immense amount of time. Thus, it has become an important subject or challenge for a portable terminal which frequently changes in broadcast area.

SUMMARY OF THE INVENTION

The present invention has been made in view of the foregoing. An object of the present invention is to shorten a broadcast wave scan time for each channel with no execution of broadcasting, thereby making it possible to shorten a total time required to perform broadcast wave scans on all channels and achieve a power saving operation.

According to one aspect of the present invention, there is provided a channel detecting method for digital broadcast, which executes a tuning process, a synchronous establishment process, a determining process, a demodulating process, a decode process and a transition process.

The tuning process sets a channel in a predetermined frequency band with respect to a broadcast wave constituted of a digital signal, based on scan instructions for the broadcast wave, selects the set channel and takes tuning thereto. The synchronous establishment process performs synchronous establishment on a result of the tuning process thereby to perform the output of a synchronous recovery signal, and starts to count a predetermined time. The determining process determines whether broadcasting is being conducted over the channel before the counting of the predetermined time is completed. The demodulating process demodulates the synchronous recovery signal thereby to perform the output of a TS signal.

The decode process performs decoding of the TS signal and extracting of a broadcast parameter with respect to the TS signal. The transition process receives instructions for transition to a next the channel when the extraction of the broadcast parameter is completed or the broadcast parameter is unextractable, and when the counting of the predetermined time is completed, sets the next channel to the tuning process if the channel is found not to be a final channel and terminates channel detection if the channel is found to be the final channel.

According to another aspect of the present invention, there is provided a receiver for digital broadcast, which includes a tuner, a synchronous establishment unit, clocking means, determining means, demodulating means, decode means and control means.

The tuner sets a channel in a predetermined frequency band with respect to a broadcast wave, based on scan instructions for the broadcast wave, selects the set channel and tunes in thereto. The synchronous establishment unit performs synchronous establishment on a result of tuning by the tuner thereby to output a synchronous recovery signal. The clocking means starts to count a predetermined time when the synchronous establishment unit has performed the synchronous establishment. The determining means determines whether broadcasting is being conducted over the channel before the counting of the predetermined time is completed. The demodulating means demodulates the synchronous recovery signal thereby to output a TS signal.

The decode means decodes the TS signal and extracts a broadcast parameter with respect to the TS signal. The control means receives instructions for transition to a next the channel when the extraction of the broadcast parameter is completed or the broadcast parameter is unextractable, and when the counting of the predetermined time is completed, sets the next channel to the tuning process if the channel is found not to be a final channel and terminates channel detection if the channel is found to be the final channel.

According to the channel detecting method for digital broadcast, of the present invention and the receiver using the same, synchronous establishment is conducted and the counting of a predetermined time is started. Further, it is determined whether broadcasting is conducted on the channel, before the counting of the predetermined time is completed. It is therefore possible to make a decision as to the presence or absence of broadcasting in a short period of time and shorten the time required to retrieve all given channels.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

In a channel detecting method, a channel lying in a predetermined frequency band with respect to a broadcast wave is set, and the set channel is selected and tuning to the channel is taken. Synchronous establishment is effected on the result of tuning thereby to output a synchronous recovery signal, and the counting of a predetermined time is started. Before the counting of the predetermined time is completed, it is determined whether broadcasting is being conducted over the channel. The synchronous recovery signal is demodulated to output a TS signal.

Further, the TS signal is decoded and the extraction of a broadcast parameter with respect to the TS signal is performed. When the extraction of the broadcast parameter is completed or the broadcast parameter is unextractable, instructions for transition to the next channel are given. When the counting of the predetermined time is completed, the next channel is set to the tuning process if the channel is found not to be a final channel, whereas if the channel is found to be the final channel, then channel detection is ended.

A receiver includes a tuner, a synchronous establishment unit, clocking means, determining means, demodulating means, decode means and control means.

The tuner sets a channel in a predetermined frequency band with respect to a broadcast wave, selects the set channel and tunes in thereto. The synchronous establishment unit performs synchronous establishment on the result of tuning thereby to output a synchronous recovery signal. The clocking means starts to count a predetermined time. The determining means determines whether broadcasting is being conducted over the channel. The demodulating means demodulates the synchronous recovery signal thereby to output a TS signal.

The decode means decodes the TS signal and extracts a broadcast parameter. The control means receives instructions for transition to the next channel, and when the counting of the predetermined time is completed, sets the next channel to the tuning process if the channel is found not to be a final channel and terminates channel detection if the channel is found to be the final channel.

Preferred embodiments of the present invention will hereinafter be described with reference to the accompanying drawings.

First Preferred Embodiment

Configuration of First Embodiment

Figure 4:
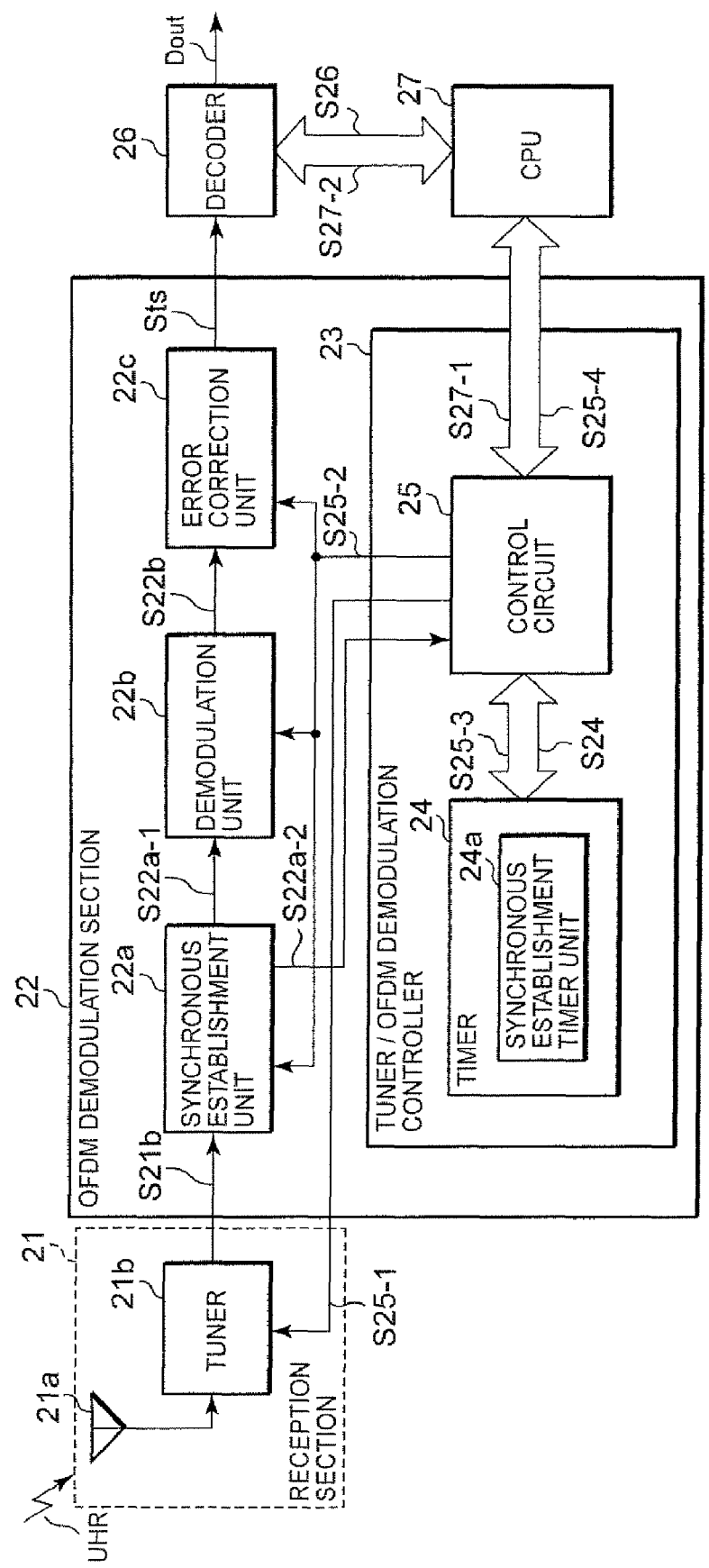
FIG. 4 is a schematic block diagram showing the digital terrestrial broadcasting receiver according to the first embodiment of the present invention.

FIG. 4 is a schematic block diagram showing a receiver (e.g., digital terrestrial broadcasting receiver) for digital broadcast, according to a first embodiment of the present invention.

The digital terrestrial broadcasting receiver has a reception section 21 which receives a broadcast wave UHF that consists of a digital broadcast wave and outputs a baseband signal S21b, and an OFDM demodulation section 22 which demodulates the baseband signal S21b and outputs the demodulated baseband signal S21b as a TS signal Sts.

Decode means (e.g., decoder) 26, which decodes the TS signal Sts thereby to output output data $D_{out}$ therefrom and outputs a decode signal S26, is connected to the output side of the OFDM demodulation section 22. Further, the decoder 26 is connected with a CPU 27 which outputs a broadcast wave scan start/end instruction S27-1 and a control signal S27-2.

The reception section 21 comprises an antenna 21a for receiving the broadcast wave UHF, and a tuner 21b which is inputted with a tuning control signal S25-1, selects a channel in a predetermined frequency band with respect to the broadcast wave UHF, and outputs a baseband signal S21b.

The OFDM demodulation section 22 comprises a synchronous establishment unit 22a which performs synchronous establishment on the baseband signal S21b thereby to output a synchronous playback or reproduction signal S22a-1 and outputs a synchronous establishment signal S22a-2, a demodulation unit 22b which performs fast Fourier transform on the synchronous recovery signal S22a-1 thereby to output a demodulated signal S22b, an error correction unit 22c which corrects an error of the demodulated signal S22b and effects deinterleave processing thereon thereby to output a TS signal Sts, and a tuner/OFDM demodulation controller 23 which outputs a tuning control signal S25-1 to the tuner 21b and controls the synchronous establishment unit 22a, demodulation unit 22b and error correction unit 22c.

The tuner/OFDM demodulation controller 23 comprises a timer 24 which outputs a timer expiration signal S24, and a control circuit 25 which corresponds not only to determining means but also to control means. The timer 24 has clocking or timing means (e.g., synchronous establishment timer unit) 24a which counts a predetermined time, based on a control signal S25-3. The control circuit 25 is inputted with the broadcast wave scan start/end instruction S27-1 and the synchronous establishment signal S22a-2, outputs the tuning control signal S25-1, control signal S25-2, control signal S25-3, and broadcast wave scan completion signal S25-4 and notifies that the TS signal Sts has been outputted.

Method of First Embodiment

Figure 1:
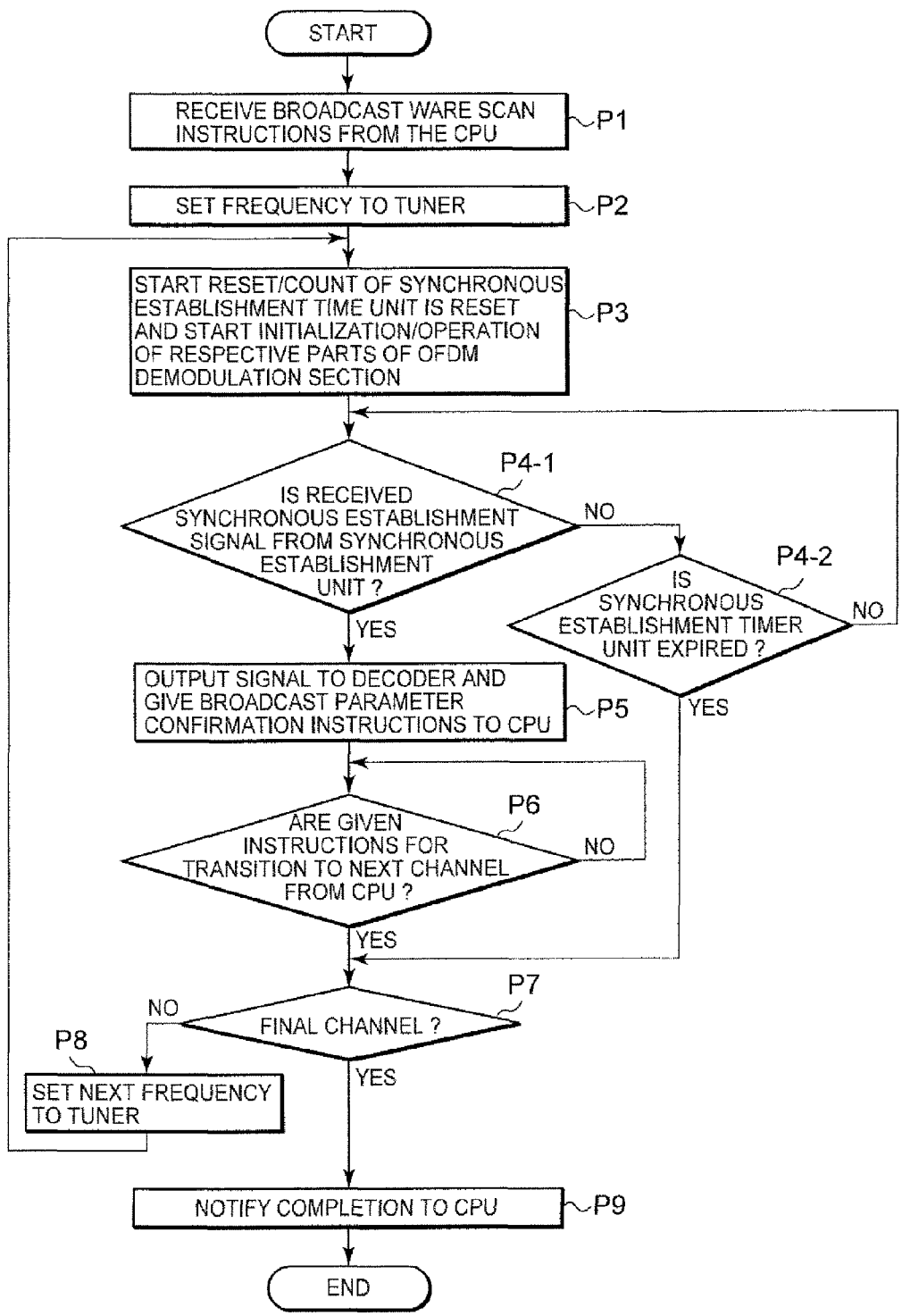
FIG. 1 is a flowchart showing processing procedures of a channel detecting method for digital broadcast at a digital terrestrial broadcasting receiver according to a first embodiment of the present invention.
Figure 2:
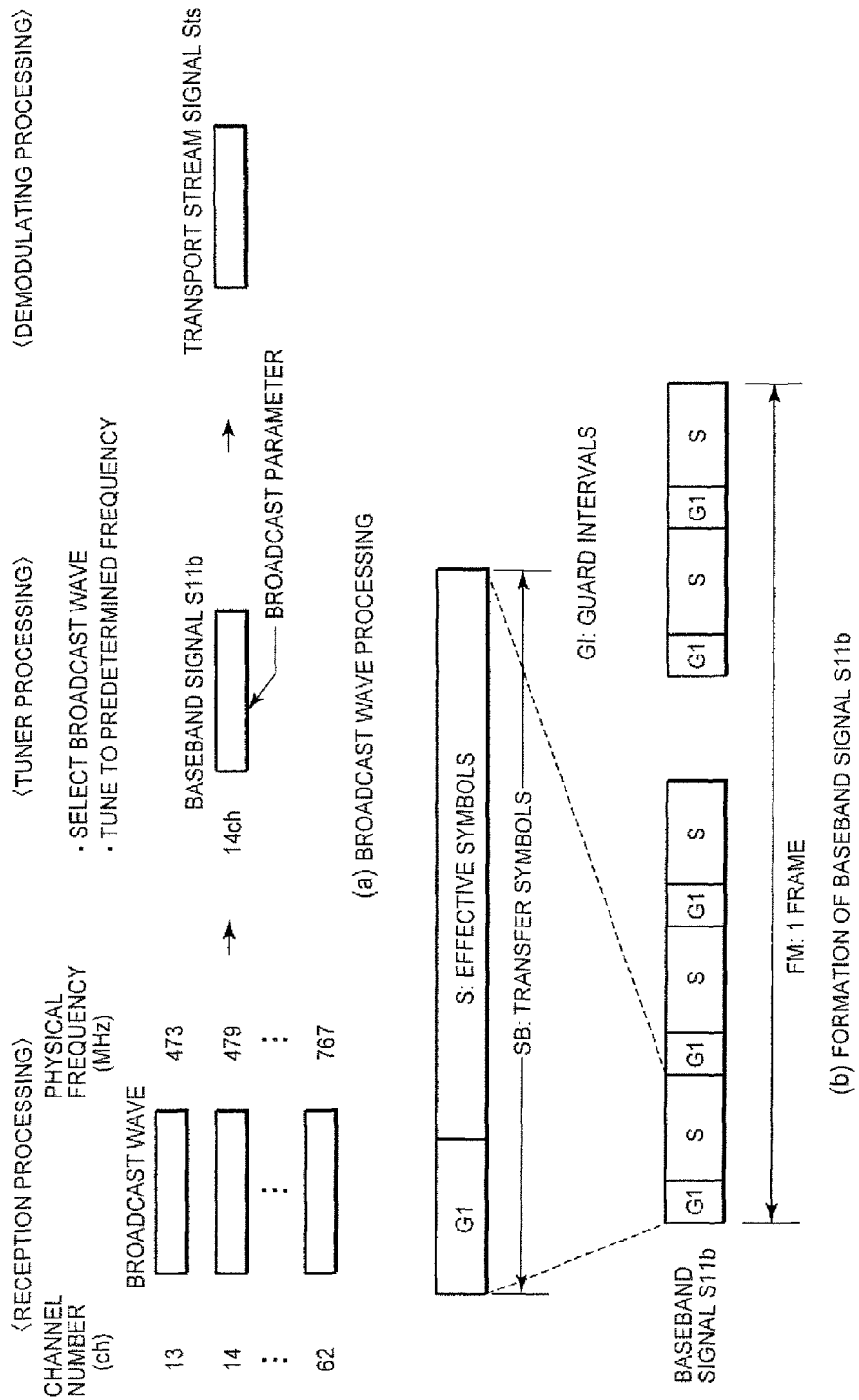
FIG. 2 is a diagram illustrating a conventional digital broadcast demodulating method.
Figure 3:
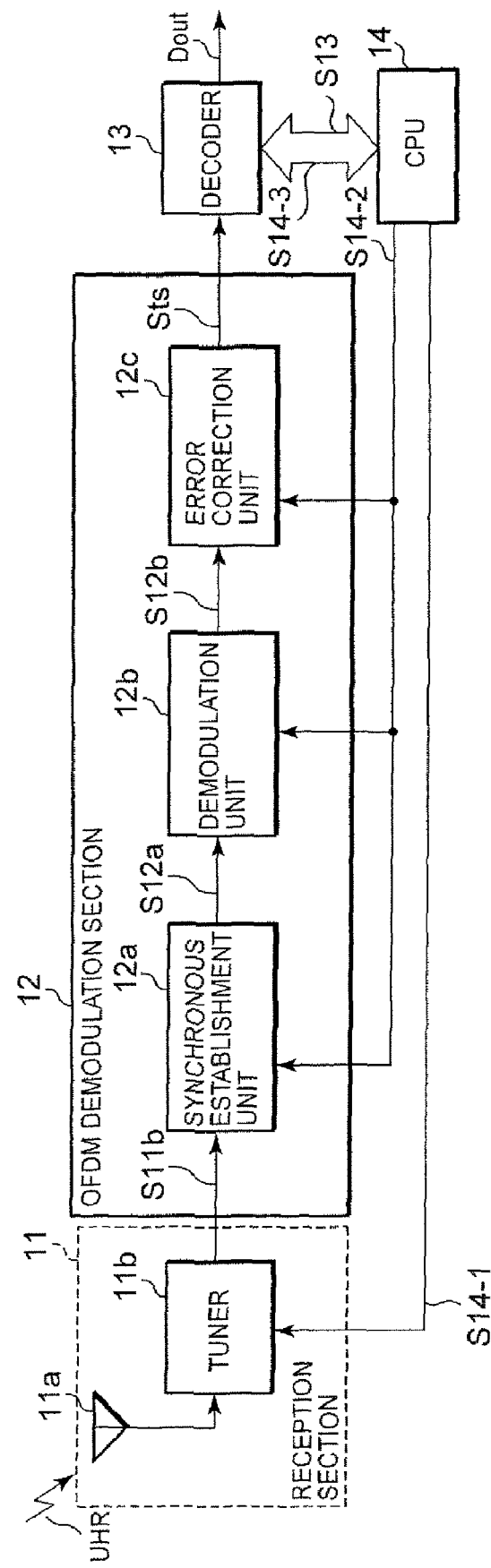
FIG. 3 is a schematic block diagram depicting a conventional digital terrestrial broadcasting receiver.

FIG. 1 is a flowchart showing processing procedures of a channel detecting method for digital broadcast at the digital terrestrial broadcasting receiver according to the first embodiment of the present invention.

The channel detecting method is executed in accordance with the following processing procedures (1) through (6).

(1) Tuning Process

The control circuit 25 receives a broadcast scan start/end instruction S27-1 from the CPU 27 (process P1) and performs tuning control on the tuner 21b (process P2).

(2) Synchronous Establishment Process

When the tuner 21b has completed tuning to a predetermined frequency, a control signal S25-2 is outputted from the control circuit 25, so that the synchronous establishment unit 22a, demodulation unit 22b and error correction unit 22c are initialized to start operating. The synchronous establishment timer unit 24a is reset to start counting (process P3).

(3) Determining Process

When the control circuit 25 has received a synchronous establishment signal S22a-2 from the synchronous establishment unit 22a before the synchronous establishment timer unit 24a is expired or completed (process P4-2), it is determined that broadcasting is being carried out over a channel in a predetermined frequency band (process P4-1).

(4) Demodulating Process

The OFDM demodulation section 22 outputs a TS signal Sts to the decoder 26. Further, the control circuit 25 notifies to the CPU 2 that the decoder 26 is detecting a broadcast parameter (process P5).

(5) Decode Process

The TS signal Sts is decoded and the extraction of the corresponding broadcast parameter from the TS signal Sts is performed (not shown).

(6) Transition Process

The CPU 27 instructs transition to the next channel when the extraction of the broadcast parameter for the corresponding channel is completed or the broadcast parameter is judged to be unextractable (process P6). If the channel is found not to be the final channel (process P7), then the operation for transition to the next channel is performed (process P8), and the processing procedures P3 through P7 are repeated. If not so, then the routine procedure is terminated (process P9). When the synchronous establishment timer unit 24a is expired without receiving the synchronous establishment signal 22a-2 outputted from the synchronous establishment unit 22a (process P4-2), it is determined that no broadcast is made to the corresponding channel. If the channel is found not to be the final channel (process P7), then the operation for transition to the next channel is carried out (process P8), and the processing procedures P3 through P7 are repeated. If no so, then the routine procedure is ended (process P9).

Here, the broadcast wave scan time of the digital terrestrial broadcasting receiver shown in FIG. 4 at the time that the above processing procedures have been executed is calculated as follows: Assuming that the time required for the process P2 of the tuner 21b is T21b, the time required for the process P4-1 of the synchronous establishment unit 22a is T22a, the conversion processing time of the demodulation unit 22b is T22b, the time required for the error correcting process of the error correction unit 22c is T22c, the time required for the decode process of the decoder 26 is T26, the time required for each of the processes P1 and P6 for performing control to the respective blocks from the CPU 27 is T27, and the number of all channels given is N, the total time Tt is expressed in the following equation (4):

$$Tt=(T21b+T22a+T22b+T22c+T26+T27)\times N \quad (4)$$

Further, assuming that the number of channels at which the synchronous establishment unit 22a has detected that broadcasting is being conducted, is N1, and the number of channels at which the synchronous establishment unit 22a has not detected that broadcasting is being conducted, is N2, the demodulation unit 22b, error correction unit 22c and decoder 26 are not operated when no broadcasting is conducted. Since the CPU 27 is operated when a broadcast wave scan is started and ended, the following equation (5) is obtained from the equation (4):

$$Tt=(T21b+T22a+T22b+T22c+T26+T27)\times N1+(T21b+T22a)\times N2+T27 \quad (5)$$

It is understood from the equation (5) that the total time Tt can be shortened as compared with the conventional channel detecting method for digital broadcast.

Effects of First Embodiment

According to the channel detecting method for digital broadcast according to the first embodiment, and the receiver using the same, the presence or absence of the broadcast is determined based on the synchronous establishment signal S22a-2 outputted from the synchronous establishment unit 22a, using the synchronous establishment timer unit 24a. Thus, the following effects of (a) and (b) are brought about.

(a) Since the processing times T22b, T22c and T26 can be shortened when no broadcast is carried out, the total time Tt for the broadcast wave scan can be shortened.

(b) Since it is possible to automatically control the tuner 21b, the synchronous establishment unit 22a, the demodulation unit 22b, and the error correction unit 22c, the load on the CPU 27 can be lightened and other image processing and voice or audio processing can be carried out. Further, a power-saving operation can also be performed if other processing also remains nonexistent.

Second Preferred Embodiment

Configuration of Second Embodiment

Figure 5:
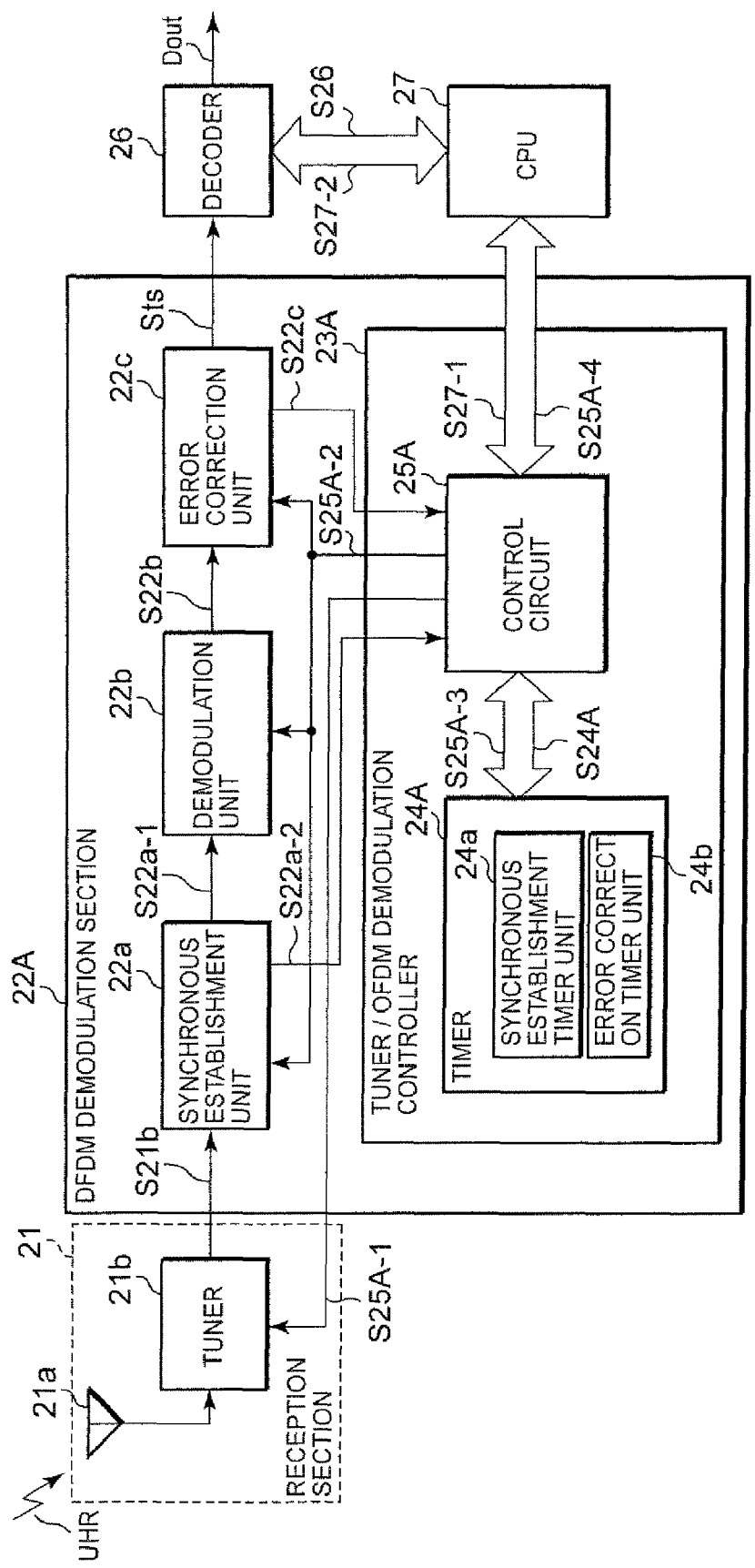
FIG. 5 is a schematic block diagram illustrating a digital terrestrial broadcasting receiver according to a second embodiment of the present invention.

FIG. 5 is a schematic block diagram showing a receiver (e.g., digital terrestrial broadcasting receiver) for digital broadcast, according to a second embodiment of the present invention. Elements common to those shown in FIG. 4 illustrating the first embodiment are respectively given common reference numerals.

The digital terrestrial broadcasting receiver according to the second embodiment has a reception section 21 similar to that of the first embodiment, an OFDM demodulation section 22A different in constitution from that of the first embodiment, a decoder 26 similar to that of the first embodiment, and a CPU 27 similar to that of the fist embodiment.

The OFDM demodulation section 22A is different from the OFDM demodulation section 22 of the first embodiment in that an error correction unit 22c does not contain errors originally or outputs a correct decode signal S22c indicative of the information that all errors have been corrected, and different therefrom in terms of the configuration of a tuner/OFDM demodulation controller 23A.

The tuner/OFDM demodulation controller 23A is constituted of a timer 24A which outputs a timer expiration signal S24A, and a control circuit 25A which corresponds not only to first and second determining means but also to control means. The timer 24A has first clocking or timing means (e.g., synchronous establishment timer unit) 24a which counts a first time, based on a control signal S25A-3, and second clocking or timing means (e.g., error correction timer unit) 24b which counts a second time, based on the control signal S25A-3. The control circuit 25A is inputted with a broadcast wave scan start/end instruction S27-1, a synchronous establishment signal S22a2 and the correct decode signal S22c, outputs a tuning control signal S25A-1, a control signal 325A-2, the control signal S25A-3, and a broadcast wave scan completion signal S25A-4, and notifies that a TS signal Sts has been outputted.

Method of Second Embodiment

Figure 6:
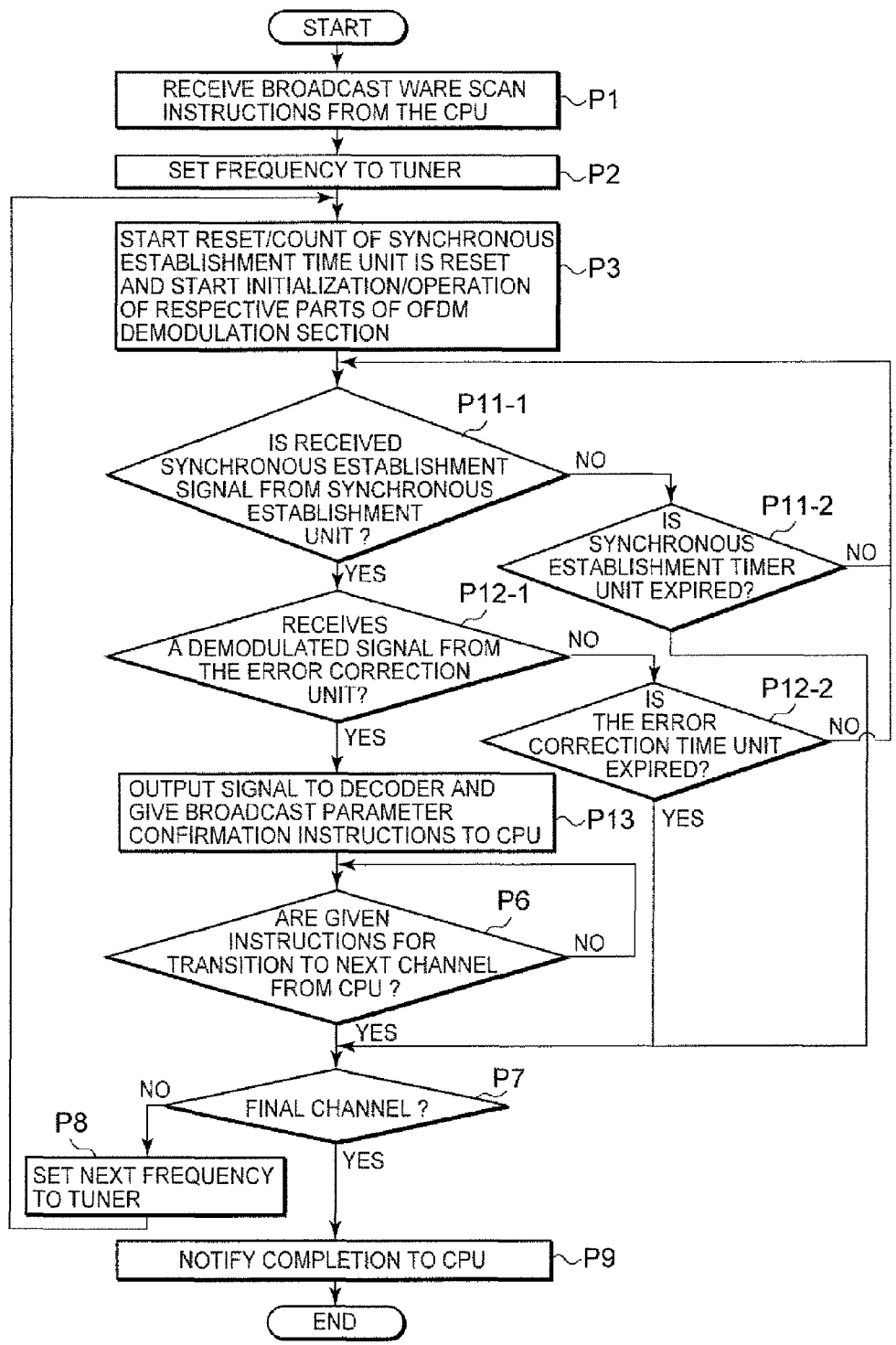
FIG. 6 is a flowchart showing processing procedures of a channel detecting method for digital broadcast at the digital terrestrial broadcasting receiver shown in FIG. 5.

FIG. 6 is a flowchart showing processing procedures of a channel detecting method for digital broadcast at the digital terrestrial broadcasting receiver shown in FIG. 5. Elements common to those shown in FIG. 1 illustrating the first embodiment are respectively given common reference numerals.

The channel detecting method is executed in accordance with the following processing procedures (1) through (7).

(1) Tuning Process

Processes P1 and P2 each similar to the tuning process of the first embodiment are performed.

(2) Synchronous Establishment Process

A process P3 similar to the tuning process of the first embodiment is carried out.

(3) First Determining Process

The first determining process is different from the determining process of the first embodiment. When the synchronous establishment signal S22a-2 outputted from the synchronous establishment unit 22a is received before the synchronous establishment timer unit 24a is expired (process P11-2), it is determined that broadcasting is being conducted over a channel in a predetermined frequency band. Further, the error correction timer unit 24b is reset to start counting (process P11-1).

(4) Second Determining Process

The second determining process is different from the determining process of the first embodiment. When the correct decode signal S22c outputted from the error correction unit 22c is received before the error correction timer unit 24b is expired (process P12-2), it is determined that broadcasting is being conducted over a channel in a predetermined frequency band (process P12-1).

(5) Error Correcting Process

The error correcting process is different from the demodulating process of the first embodiment. The error correction unit 22c outputs a TS signal Sts to the decoder 26. Further, the control circuit 25A notifies to the CPU 27 that the decoder 26 is detecting a broadcast parameter (process P13).

(6) Decode Process

A process similar to the decode process of the first embodiment is performed (not shown).

(7) Transition Process

Unlike the transition process of the first embodiment, the CPU 27 instructs transition to the next channel when the extraction of the broadcast parameter for the corresponding channel is completed or judged to be unextractable (process P6). If the channel is found not to be the final channel (process P7), then the operation for transition to the next channel is performed (process P8), and the processing procedures P3 through P7 are repeated. If not so, then the routine procedure is terminated or ended (process P9).

When the synchronous establishment timer unit 24a is expired without receiving the synchronous establishment signal 22a-2 outputted from the synchronous establishment unit 22a (process P11-2), it is determined that broadcasting is not conducted over the corresponding channel. If the channel is found not to be the final channel (process P7), then the operation for transition to the next channel is performed (process P8), and the processing procedures P3 through P7 are repeated. If not so, then the routine procedure is ended (process P9).

When the error correction timer unit 24b is expired without receiving the correct decode signal S22c outputted from the error correction unit 22c after the synchronous establishment signal S22a-2 has been received (process P12-2), it is determined that no broadcasting is made to the corresponding channel. If the channel is found not to be the final channel (process P7), then the operation for transition to the next channel is carried out (process P8), and the processing procedures P3 through P7 are repeated. If no so, then the routine procedure is ended (process P9).

Here, the broadcast wave scan time of the digital terrestrial broadcasting receiver shown in FIG. 5 at the time that the above processing procedures have been executed is calculated as follows:

Assuming that upon the error correcting process, the number of channels at which it is determined that broadcasting is being performed properly, is N11, and the number of channels at which broadcasting is being performed erroneously, is N12, the following equation (6) is obtained from the equation (5):

$$Tt=(T21b+T22a+T22b+T22c+T26+T27)\times(N11+N12)+(T21b+T22a)\times N2+T27 \quad (6)$$

Since the processes of the decoder 26 and the CPU 27 are omitted when it is determined that broadcasting is being conducted erroneously, the following equation (7) is obtained from the equation (6).

$$Tt=(T21b+T22a+T22b+T22c+T26+T27)\times N11+(T21b+T22a+T22b+T22c)\times N12+(T21b+T22a)\times N2+T27 \quad (7)$$

It is understood from the equation (7) that the total time Tt can be shortened as compared with the channel detecting method for digital broadcast according to the first embodiment.

Effects of Second Embodiment

According to the channel detecting method for digital broadcast according to the second embodiment, and the receiver using the same, the presence or absence of the broadcast is determined based on the correct decode signal S22c outputted from the error correction unit 22c, using the error correction timer unit 24b. Thus, the following effects are brought about in addition to the effects of the first embodiment.

Since misdetermination based on the synchronous establishment signal S22a-2 is discarded, the total time Tt for the broadcast wave scan is shortened. Further, the power consumed by the decoder 26 and the CPU 27 can be reduced.

Third Preferred Embodiment

Configuration of Third Embodiment

Figure 7:
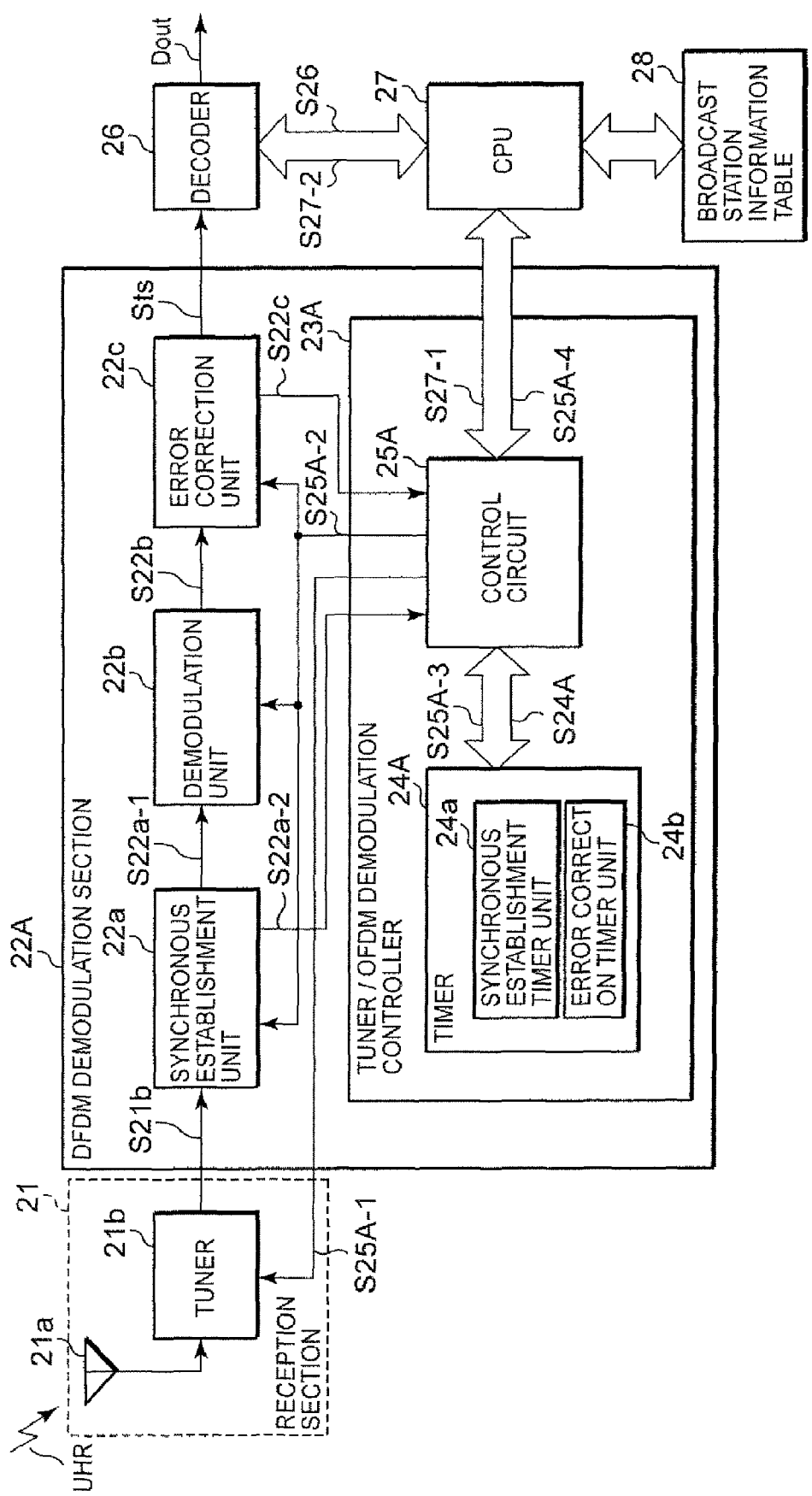
FIG. 7 is a schematic block diagram showing a digital terrestrial broadcasting receiver according to a third embodiment of the present invention.

FIG. 7 is a schematic block diagram showing a receiver (e.g., digital terrestrial broadcasting receiver) for digital broadcast, according to a third embodiment of the present invention. Elements common to those shown in FIG. 5 illustrating the second embodiment are respectively given common reference numerals.

The digital terrestrial broadcasting receiver according to the third embodiment is different from the receiver according to the second embodiment in that a broadcast station information table 28 having second broadcast station information referable from acquiring means (e.g., CPU) 27 is added. The third embodiment is similar in other configuration to the second embodiment.

Method of Third Embodiment

Figure 8:
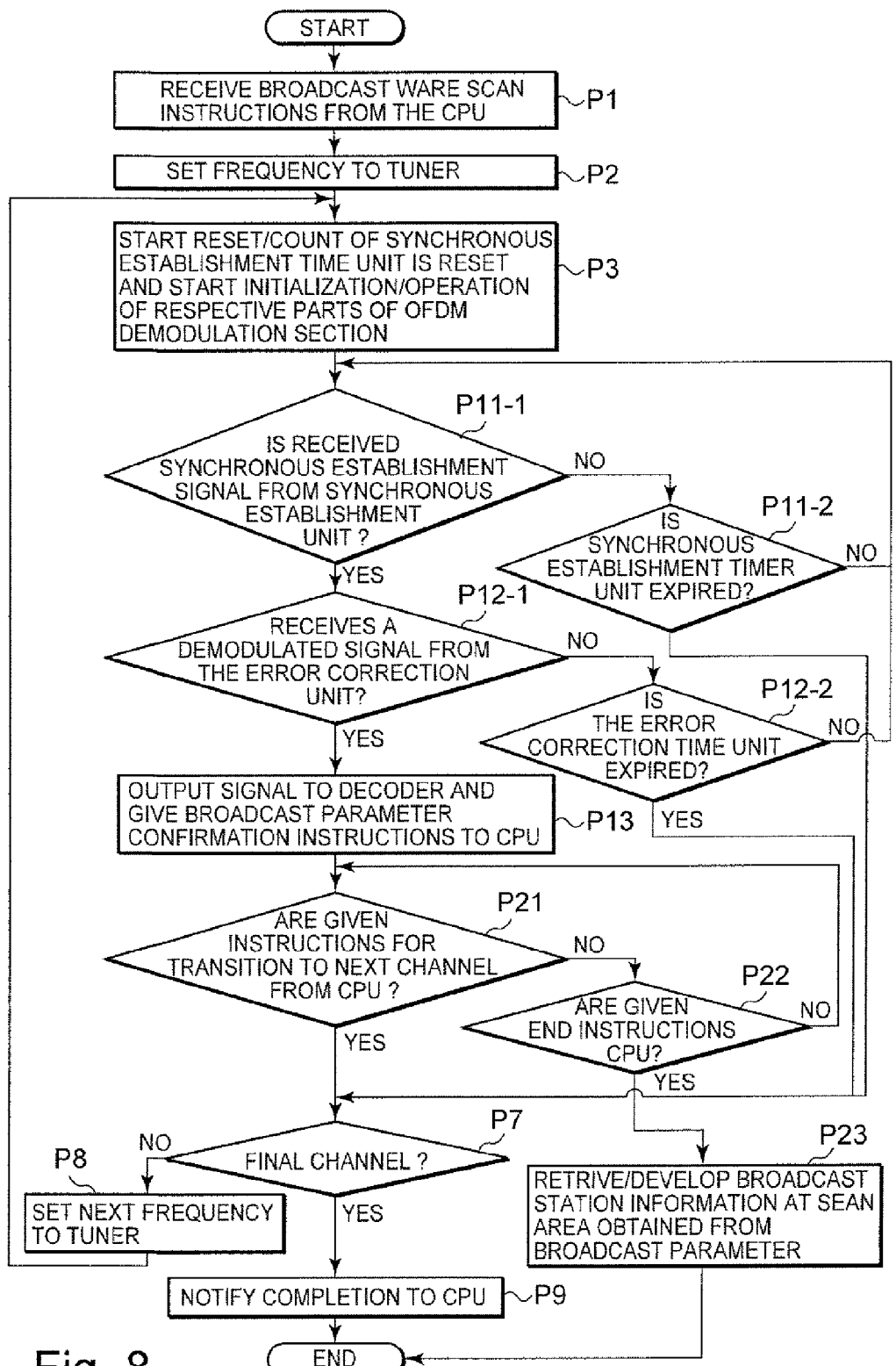
FIG. 8 is a flowchart illustrating processing procedures of a channel detecting method for digital broadcast at the digital terrestrial broadcasting receiver shown in FIG. 7.

FIG. 8 is a flowchart showing processing procedures of a channel detecting method for digital broadcast at the digital terrestrial broadcasting receiver shown in FIG. 7. Elements common to those shown in FIG. 6 illustrating the second embodiment are respectively given common reference numerals.

The operation of the digital terrestrial broadcasting receiver shown in FIG. 7 will be explained in accordance with the following operational procedures (1) through (7) using the flowchart.

(1) Tuning Process

Processes P1 and P2 similar to the tuning processes of the first and second embodiments are performed.

(2) Synchronous Establishment Process

A process P3 similar to each of the tuning processes of the first and second embodiments is carried out.

(3) First Determining Process

A process P4-1 similar to the first determining process of the second embodiment is performed.

(4) Second Determining Process

A process P11-1 similar to the second determining process of the second embodiment is performed.

(5) Error Correcting Process

A process P13 similar to the error correcting process of the second embodiment is carried out.

(6) Decode Process

A process similar to each of the decode processes of the first and second embodiments is performed (not shown).

(7) Transition Process

Unlike the transition process of the first embodiment, the CPU 27 instructs transition to the next channel when the extraction of a broadcast parameter for the corresponding channel is completed or judged to be unextractable (process P21). If the channel is found not to be the final channel (process P7), then the operation for transition to the next channel is performed (process P8), and the processing procedures P3 through P7 are repeated. If not so, then the routine procedure is terminated or ended (process P9).

When a synchronous establishment timer unit 24a is expired without receiving a synchronous establishment signal 22a-2 outputted from a synchronous establishment unit 22a (process P11-2), it is determined that broadcasting is not conducted over the corresponding channel. If the channel is found not to be the final channel (process P7), then the operation for transition to the next channel is performed (process P8), and the processing procedures P3 through P7 are repeated. If not so, then the routine procedure is ended (process P9).

When an error correction timer unit 24b is expired without receiving a correct decode signal S22c outputted from an error correction unit 22c after the synchronous establishment signal S22a-2 has been received (process P12-2), it is determined that no broadcasting is made to the corresponding channel. If the channel is found not to be the final channel (process P7), then the operation for transition to the next channel is carried out (process P8), and the processing procedures P3 through P7 are repeated. If no so, then the routine procedure is ended (process P9).

(8) Acquiring Process

In the channel detecting method for digital broadcast at the digital terrestrial broadcasting receiver according to the third embodiment, the CPU 27 instructs an end when the extraction of a broadcast parameter containing first broadcast station information on the corresponding channel is completed (process P22). After the CPU 27 has instructed the end, it acquires the second broadcast station information held in the broadcast station information table 28 by its retrieval and development (process P23).

Here, the broadcast wave scan time of the digital terrestrial broadcasting receiver shown in FIG. 7 at the time that the above processing procedures have been executed is calculated as follows.

Since broadcast wave scan results are obtained when the broadcast parameter has firstly been confirmed, N11=1. Assuming that the number of channels up to the acquisition of the broadcast parameter, at which it is determined that broadcasting is not conducted, is N3, the following equation (8) is obtained from the equation (7):

$$Tt=(T21b+T22a+T22b+T22c+T26+T27)\times(T21b+T22a+T22b+T22c)\times N12+(T21b+T22a)\times N3+T27 \qquad (8)$$

It is understood from the equation (8) that the total time Tt can be shortened as compared with the channel detecting method for digital broadcast according to the second embodiment.

Effects of Third Embodiment

According to the digital terrestrial broadcasting receiver of the third embodiment, the following effects are brought about owing to the provision of the broadcast station information table 28 in addition to the effects of the first and second embodiments.

It is possible to reduce the number of channels at which a broadcast wave scan is performed, and to end or terminate the broadcast wave scan in a very short period of time. Since the broadcast wave scan results are obtained by simply identifying each broadcast area, the present embodiment is suitable for use in portable terminals such as a cellular phone, car navigation equipment, etc. at which the broadcast area frequently changes.

Modified Examples

The present invention is not limited to the first, second and third embodiments referred to above. Various use forms and modifications can be made. As the usage forms and modified examples, there may be mentioned, for example, the following (a) through (e).

(a) Although the synchronous establishment timer unit 24a and the error correction timer unit 24b are provided separately in the second and third embodiments, they can be shared therebetween if they are separated on a time basis. Sharing the same therebetween enables a reduction in mounting area.

(b) Although the control circuit 25 is used for the determining process in the first, second and third embodiments, such a circuit configuration that a decision as to whether broadcasting is being conducted over a channel in a predetermined frequency band can be made is enough therefor.

(c) Although the decoder 26 is used for decode processing of the first, second and third embodiments, it may also be constituted of a logical circuit obtained by combining a NOT circuit, an AND circuit and the like.

(d) Although the control circuit 25 is used in the transition process in the first, second and third embodiments, such a circuit configuration as to perform control that when it is determined that no broadcasting is done over a set channel, the transition to a search for the next channel is made or processing is ended when the final channel is taken, is enough therefor.

(e) Although the digital terrestrial broadcasting receiver has been described in the first, second and third embodiments, it can be applied even to a portable terminal corresponding to one segment, car navigation equipment, and other digital broadcast such as BS digital or the like.

While the preferred forms of the present invention have been described, it is to be understood that modifications or changes will be apparent to those skilled in the art without departing from the spirit of the invention. The scope of the invention is to be determined solely by the following claims.

What is claimed is:

1. A channel detecting method for digital broadcast, which executes the following processes:
   a tuning process for setting a channel in a predetermined frequency band with respect to a broadcast wave constituted of a digital signal, based on scan instructions for the broadcast wave, selecting the set channel and tuning in thereto;
   a synchronous establishment process for performing synchronous establishment on a result of the tuning process thereby to output a synchronous recovery signal and starting to count a predetermined time;
   a determining process for determining whether broadcasting is being conducted over the channel before the counting of the predetermined time is completed;
   a demodulating process for demodulating the synchronous recovery signal thereby to output a transport stream signal;
   a decode process for decoding the transport stream signal and extracting a broadcast parameter with respect to the transport stream signal; and
   a transition process for receiving instructions for transition to a next said channel when the extraction of the broadcast parameter is completed or the broadcast parameter is unextractable, and when the counting of the predetermined time is completed, setting the next said channel to the tuning process if the channel is found not to be a final channel and terminating channel detection if the channel is found to be the final channel.

2. The channel detecting method according to claim 1, wherein the broadcast wave is inverse Fourier-transformed transmission data.

3. The channel detecting method according to claim 1, wherein the demodulating process performs fast Fourier transform thereby to demodulate the synchronous recovery signal.

4. The channel detecting method according to claim 1, wherein the demodulating process demodulates the synchronous recovery signal and corrects an error of the demodulated synchronous recovery signal thereby to output the transport stream signal.

5. A channel detecting method for digital broadcast, which executes the following processes:
   a tuning process for setting a channel in a predetermined frequency band with respect to a broadcast wave, based on scan instructions for the broadcast wave, selecting the set channel and tuning in thereto;
   a synchronous establishment process for performing synchronous establishment on a result of the tuning process thereby to output a synchronous recovery signal and starting to count a first time;
   a first determining process for determining whether broadcasting is being conducted over the channel before the counting of the first time is completed;
   an error correcting process for demodulating the synchronous recovery signal, correcting an error of the demodulated synchronous recovery signal thereby to output a transport stream signal and starting to count a second time;
   a second determining process for determining whether broadcasting is being conducted over the channel before the counting of the second time is completed;
   a decode process for decoding the transport stream signal and extracting a broadcast parameter containing first broadcast station information from the transport stream signal; and
   a transition process for receiving instructions for transition to a next said channel when the extraction of the broadcast parameter is completed or the broadcast parameter is unextractable, and when the counting of the first time and the second time is completed, setting the next said channel to the tuning process if the channel is found not to be a final channel and terminating channel detection if the channel is found to be the final channel.

6. The channel detecting method according to claim 5, further including an acquiring process for extracting the first broadcast station information from within the broadcast parameter when the broadcast parameter is firstly extracted, developing second broadcast station information associated with the extracted first broadcast station information, and acquiring the second broadcast station information.

7. A receiver for digital broadcast, comprising:
   a tuner which sets a channel in a predetermined frequency band with respect to a broadcast wave, based on scan instructions for the broadcast wave, selects the set channel and tunes in thereto;
   a synchronous establishment unit which performs synchronous establishment on a result of tuning by the tuner thereby to output a synchronous recovery signal;
   clocking means which starts to count a predetermined time when the synchronous establishment unit has performed the synchronous establishment;
   determining means which determines whether broadcasting is being conducted over the channel before the counting of the predetermined time is completed;
   demodulating means which demodulates the synchronous recovery signal thereby to output a transport stream signal;
   decode means which decodes the transport stream signal and extracts a broadcast parameter with respect to the transport stream signal; and
   control means which receives instructions for transition to a next said channel when the extraction of the broadcast parameter is completed or the broadcast parameter is unextractable, and when the counting of the predetermined time is completed, sets the next said channel to the tuning process if the channel is found not to be a final channel and terminates channel detection if the channel is found to be the final channel.

8. The receiver according to claim 7, wherein the demodulating means comprises a demodulation unit which performs fast Fourier transform thereby to demodulate the synchronous recovery signal, and an error correction unit which corrects an error of the demodulated synchronous recovery signal thereby to output the transport stream signal.

9. A receiver for digital broadcast, comprising:
   a tuner which sets a channel in a predetermined frequency band with respect to a broadcast wave, based on scan instructions for the broadcast wave, selects the set channel and tunes in thereto;
   a synchronous establishment unit which performs synchronous establishment on a result of tuning by the tuner thereby to output a synchronous recovery signal;
   first clocking means which starts to count a first time when the synchronous establishment unit has performed the synchronous establishment;
   first determining means which determines whether broadcasting is being conducted over the channel before the counting of the first time is completed;
   a demodulation unit which demodulates the synchronous recovery signal;

an error correction unit which corrects an error of the demodulated synchronous recovery signal thereby to output a transport stream signal;

second clocking means which starts to count a second time when the error correction unit has corrected the error;

second determining means which determines whether broadcasting is being conducted over the channel before the counting of the second time is completed;

decode means which decodes the transport stream signal and extracts a broadcast parameter containing first broadcast station information from the transport stream signal; and control means which receives instructions for transition to a next said channel when the extraction of the broadcast parameter is completed or the broadcast parameter is unextractable, and when the counting of the first time and the second time is completed, sets the next said channel to the tuning process if the channel is found not to be a final channel and terminates channel detection if the channel is found to be the final channel.

10. The receiver according to claim 9, further comprising acquiring means which extracts the first broadcast station information from within the broadcast parameter when the broadcast parameter is firstly extracted, develops second broadcast station information associated with the extracted first broadcast station information, and acquires the second broadcast station information.

* * * * *